US012761252B1

(12) United States Patent
Hati et al.

(10) Patent No.: US 12,761,252 B1
(45) Date of Patent: Oct. 13, 2026

(54) ON-CHIP SUPPLY TRANSIENT DROP AND SUPPLY TRANSIENT BUMP DETECTION

(71) Applicant: Synopsys, Inc., Sunnyvale, CA (US)

(72) Inventors: Manas Kumar Hati, Medinipur West Bengal (IN); Peter Kwang Lee, Pleasanton, CA (US); Shih-Yao Christine Sun, San Jose, CA (US); Santhosh Narayana-Swamy, Campbell, CA (US)

(73) Assignee: Synopsys, Inc., Sunnyvale, CA (US)

( * ) Notice: Subject to any disclaimer, the term of this patent is extended or adjusted under 35 U.S.C. 154(b) by 91 days.

(21) Appl. No.: 18/965,937

(22) Filed: Dec. 2, 2024

(51) Int. Cl.

| | |
|---|---|
| ***G01R 19/165*** | (2006.01) |
| ***G01R 19/04*** | (2006.01) |
| ***G01R 19/25*** | (2006.01) |
| ***G01R 19/257*** | (2006.01) |
| ***G01R 35/00*** | (2006.01) |

(52) U.S. Cl.
CPC ....... *G01R 19/16528* (2013.01); *G01R 19/04* (2013.01); *G01R 19/2503* (2013.01); *G01R 19/257* (2013.01); *G01R 35/005* (2013.01)

(58) Field of Classification Search
None
See application file for complete search history.

(56) References Cited

U.S. PATENT DOCUMENTS

| | | | | |
|---|---|---|---|---|
| 5,319,514 | A * | 6/1994 | Walsh | H02H 3/253 361/85 |
| 6,970,022 | B1 * | 11/2005 | Miller | H03K 5/2481 327/205 |
| 7,925,951 | B2 | 4/2011 | Whetsel | |
| 8,154,928 | B2 | 4/2012 | Tran | |
| 8,225,156 | B1 | 7/2012 | Tabatabaei et al. | |
| 8,432,732 | B2 | 4/2013 | Li et al. | |
| 8,497,712 | B2 | 7/2013 | Nguyen et al. | |
| 8,823,419 | B1 * | 9/2014 | O'Leary | H03K 5/22 327/205 |
| 8,847,619 | B2 | 9/2014 | Hargan et al. | |
| 8,850,608 | B2 | 9/2014 | Tehranipoor et al. | |
| 9,412,940 | B2 | 8/2016 | Sacchetto et al. | |
| 9,823,282 | B2 | 11/2017 | Narayanan et al. | |
| 2007/0067129 | A1 * | 3/2007 | Mattes | G01R 35/005 702/106 |
| 2011/0043956 | A1 * | 2/2011 | Su | H03F 1/52 361/86 |

(Continued)

OTHER PUBLICATIONS

Hati et al., "A fast automatic frequency and amplitude control LC-VCO circuit with noise filtering technique for a fractional-N PLL frequency synthesizer." Microelectronics Journal 52, Jun. 2016, 13 pages.

(Continued)

Primary Examiner — Rodney E Fuller
(74) Attorney, Agent, or Firm — Korbin S Van Dyke; Haynes Beffel & Wolfeld LLP

(57) ABSTRACT

A first voltage value is determined using a comparator operating based on a first hysteresis value. A second voltage value is determined using the comparator operating based on a second hysteresis value and in dependence on the first voltage value. One or more indications of at least one of the first voltage value and the second voltage value are provided.

20 Claims, 12 Drawing Sheets

(56) References Cited

U.S. PATENT DOCUMENTS

2024/0427362 A1 * 12/2024 Panter ....................... G05F 1/56

OTHER PUBLICATIONS

Hati et al., "Phase noise analysis of proposed PFD and CP switching circuit and its advantages over various PFD/CP switching circuits in phase-locked loops." Integration 63, Sep. 2018, pp. 115-129.
Hati, PhD Thesis, "Auto Calibrated Delta Sigma Fractional-N PLL Frequency Synthesizer and a Wideband Pipeline ADC," Indian Institute of Technology Kharagpur, Dec. 2016, 266 pages.
Kay, et al., Texas Instruments White Paper, "TI Designs—Precision: Verified Design, Comparator with Hysteresis Reference Design," May 2013, revised Jun. 2014, 23 pages.
Sehgal, et al., "On-chip Real-Time Power Supply Noise Detector," 2006 Proceedings of the 32nd European Solid-State Circuits Conference, Montreaux, Switzerland, Sep. 19-21, 2006, pp. 380-383.

* cited by examiner

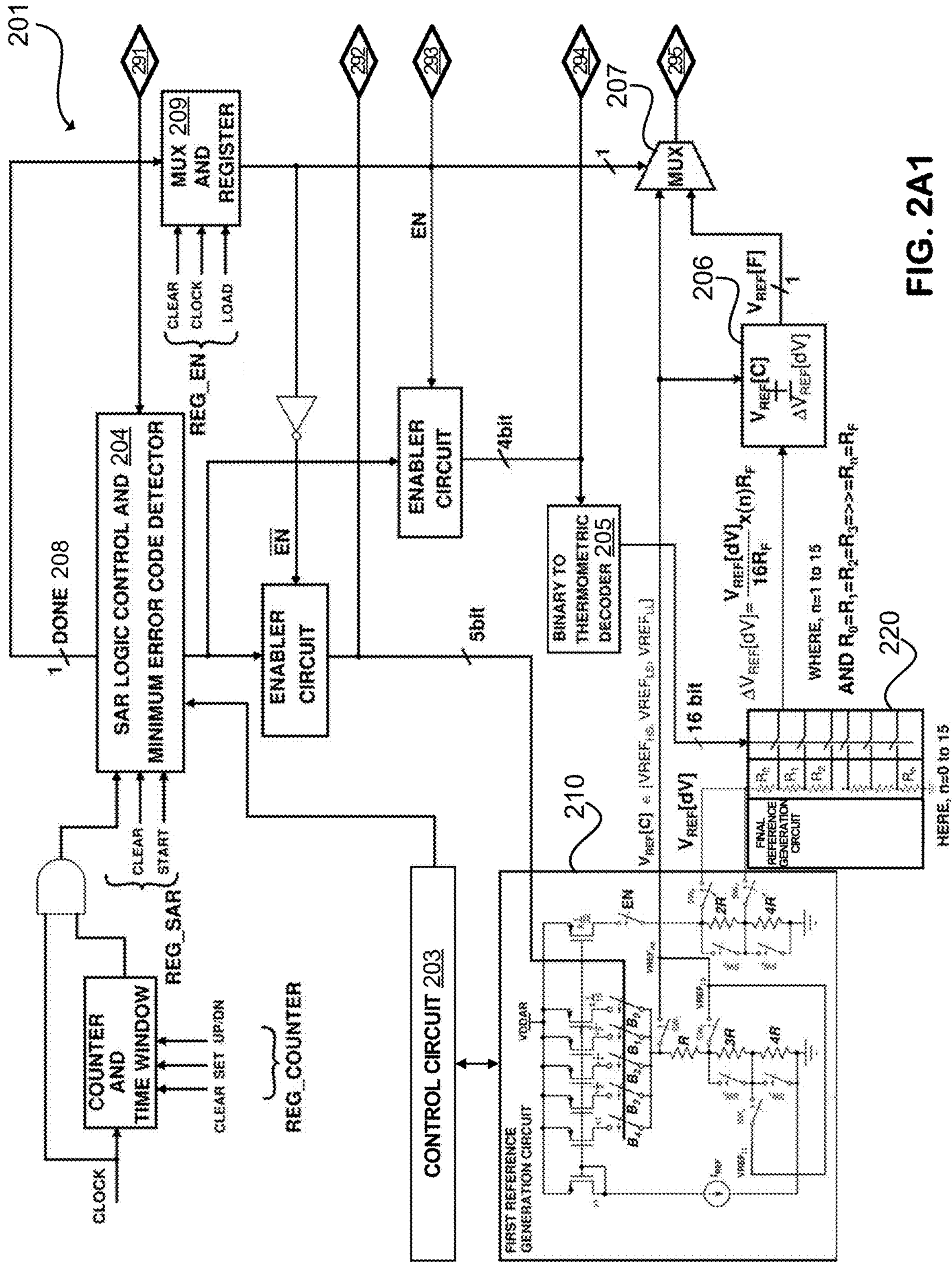
FIG. 2A1

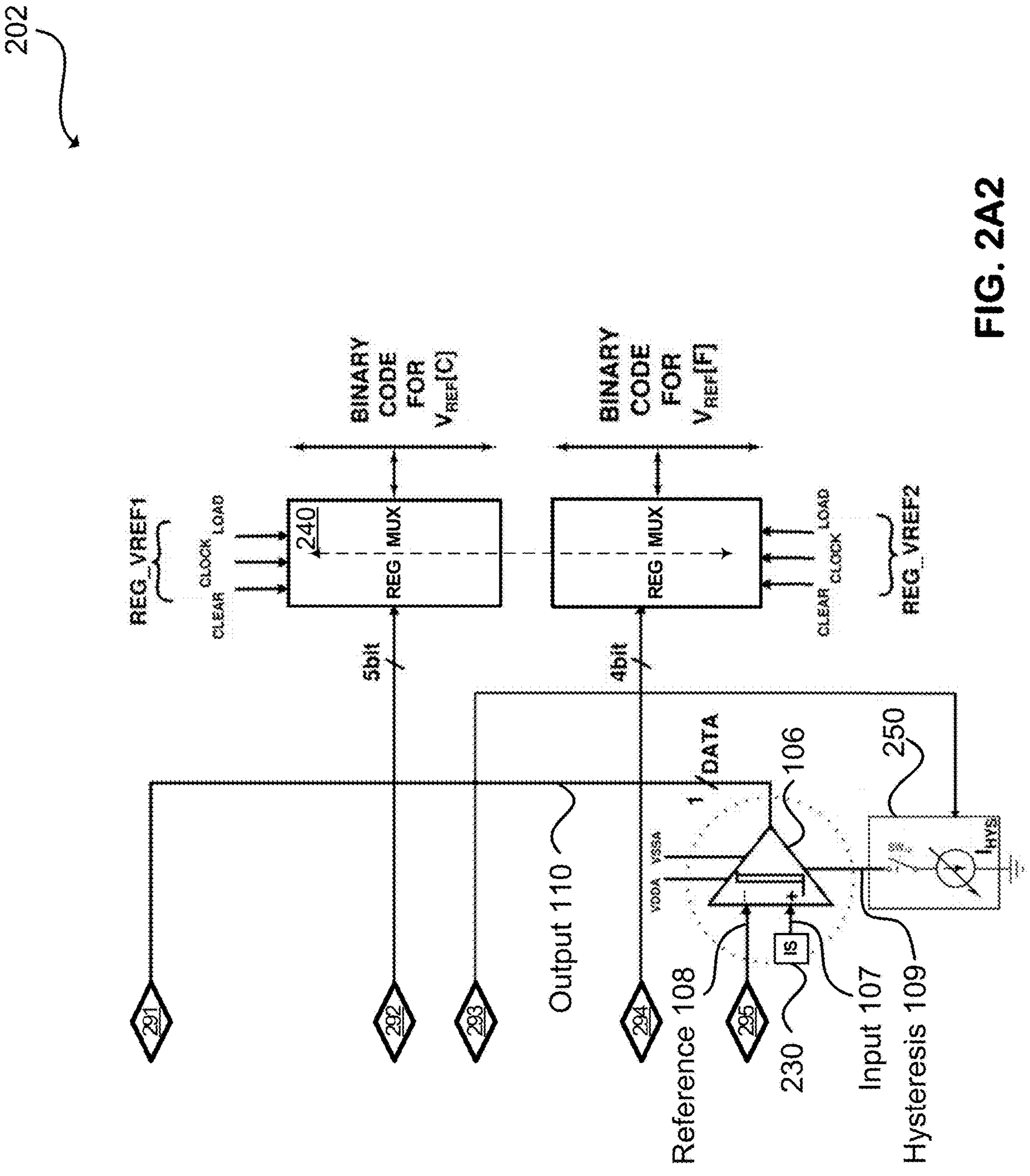
FIG. 2A2

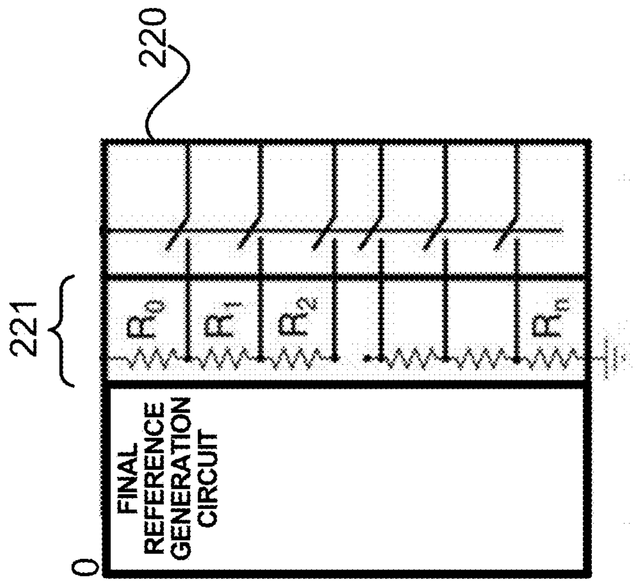
FIG. 2A4
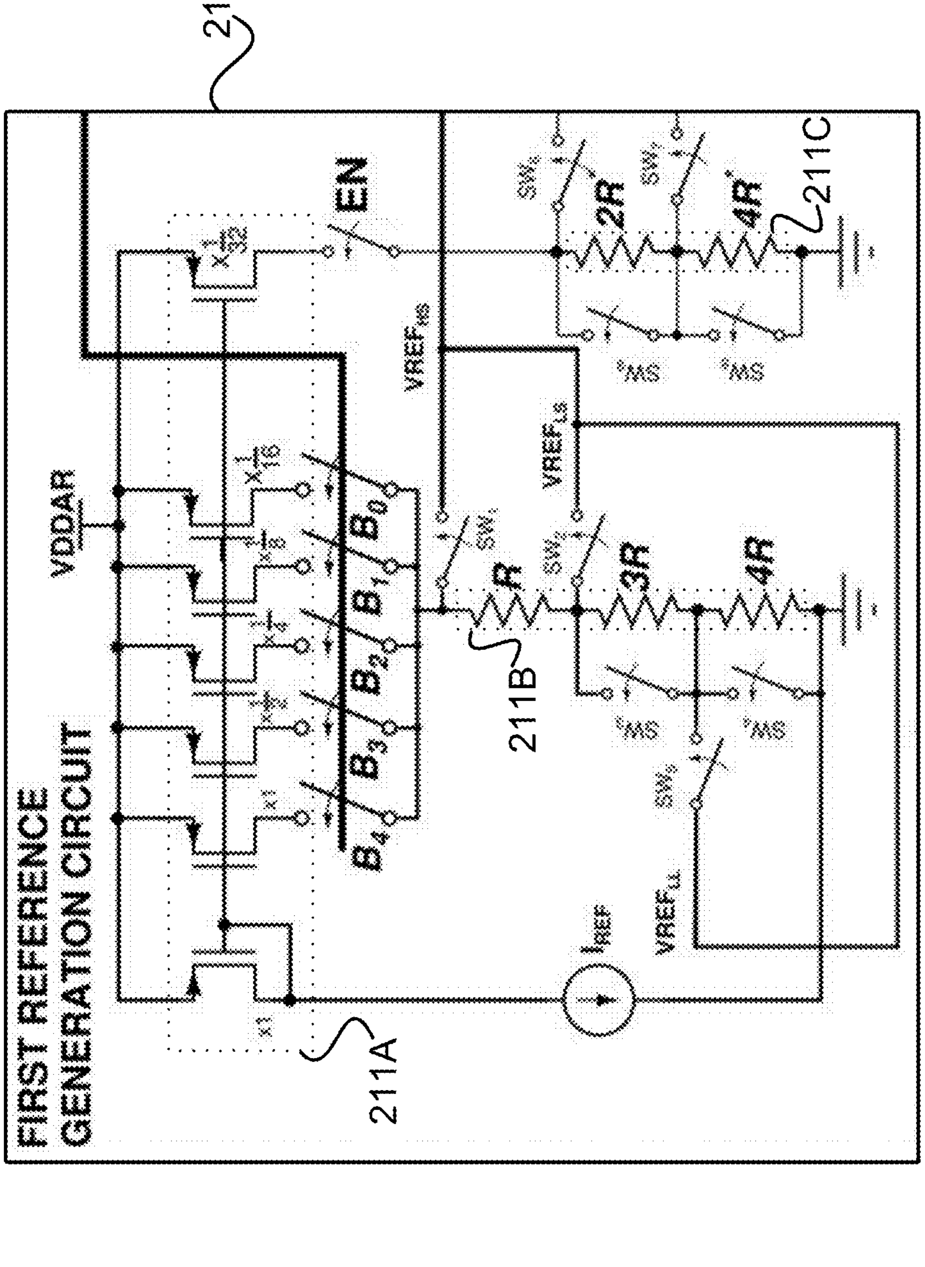
FIG. 2A3

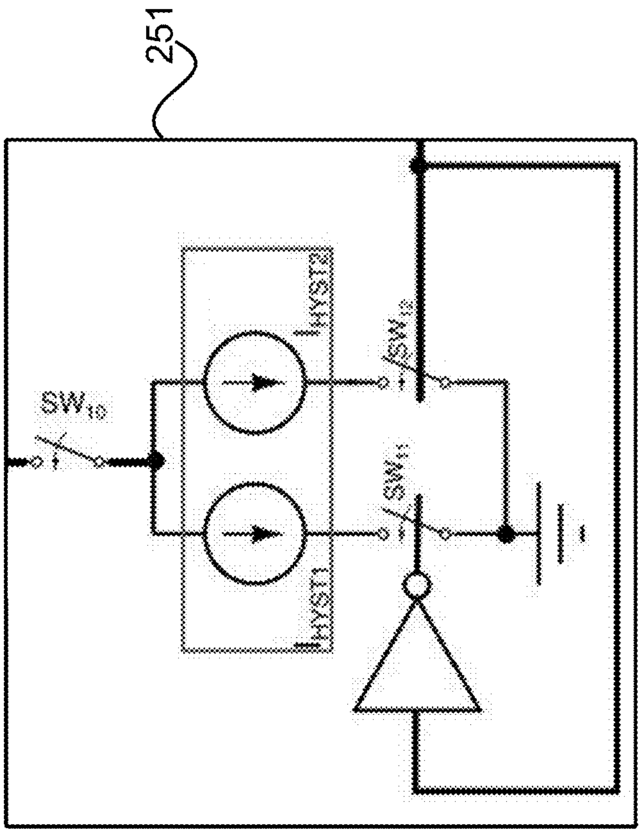
FIG. 2A6
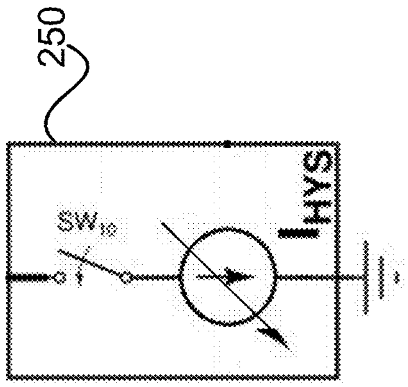
FIG. 2A5

ON-CHIP SUPPLY TRANSIENT DROP AND SUPPLY TRANSIENT BUMP DETECTION

TECHNICAL FIELD

The present disclosure generally relates to an electronic circuit. In particular, the present disclosure relates to detecting and indicating transient power supply voltage drops and transient power supply bumps occurring on an integrated circuit.

BACKGROUND

Drops and bumps, such as voltage drops and voltage bumps on a power supply, are a source of integrated circuit performance loss and/or failure. Transient voltage drops and transient voltage bumps on a power supply voltage, for example, can result in portions of an integrated circuit operating at a lower frequency than specified, or not operating at any frequency.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2A1 illustrates the enlarged left-hand portion of FIG. 2A.

FIG. 2A2 illustrates the enlarged right-hand portion of FIG. 2A.

FIG. 2A3 illustrates Coarse/Initial Reference Generation Circuit 210 of FIG. 2A1.

FIG. 2A4 illustrates Fine/Final Reference Generation Circuit 220 of FIG. 2A1.

FIG. 2A5 illustrates Variable Hysteresis Current Source 250 of FIG. 2A2.

FIG. 2A6 illustrates Multi-Value Hysteresis Current Source 251.

FIG. 5 illustrates an example flow diagram for detecting supply transients.

FIG. 6 illustrates an example timing diagram for detecting supply transients.

DETAILED DESCRIPTION

Figure 1A:
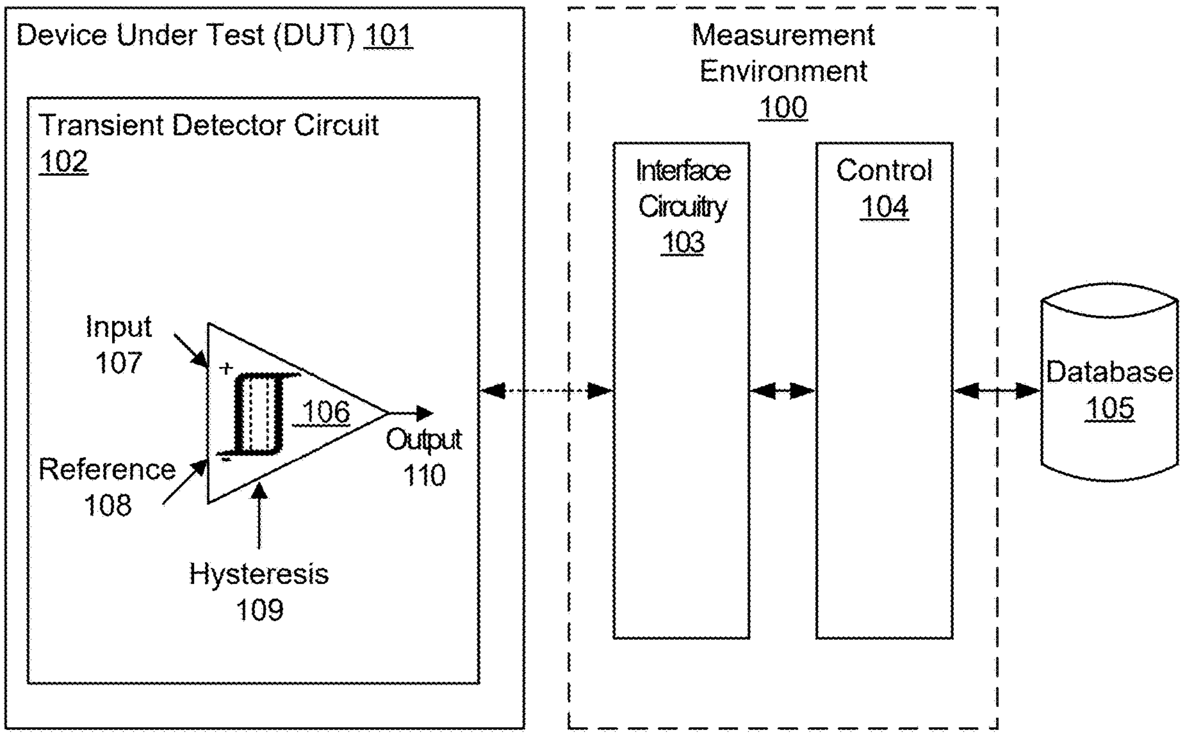
FIG. 1A illustrates a system that performs on-chip supply transient drop and supply transient bump detection on an integrated circuit.

Aspects of techniques disclosed herein relate to on-chip supply transient drop and supply transient bump detection. Chip-level supply transient drops and supply transient bumps (also referred to as chip-level power supply noise or power supply noise) can degrade chip (e.g., an integrated circuit) performance or result in functional failure.

For example, sufficiently high power supply noise results in failure, causing yield loss during production. For another example, sufficiently high power supply noise results in a reduction in a minimum voltage (Vmin) that fails to meet a specified Vmin, causing yield loss during production. For yet another example, power supply noise reduces performance of an integrated circuit. For yet another example, sufficiently high power supply noise, such as caused by current-voltage (IR) drop and exacerbated by aging of an integrated circuit, results in a failure in the field, such as in a customer system. For yet another example, sufficiently high power supply noise for a sufficiently long period, results in premature failure of an integrated circuit, such as due to voltage stress.

In various scenarios, the degradation is a result of transient conditions, undetectable by certain techniques, such as direct current (DC) and/or low-frequency techniques. In various scenarios, the degradation is localized in a relatively small area of an integrated circuit, undetectable by macro techniques, such as techniques directed to detect events in a relatively large area of an integrated circuit (e.g., a memory circuit, a third-party Intellectual Property (IP) circuit, or the entire integrated circuit).

Degradation of chip performance or functional failure can be intermittent, showing up only occasionally, causing failure analysis to be difficult. Chip-level power supply noise can degrade chip reliability or cause immediate damage, if there is an unexpected bump in power supply voltage that is moderately high above a specification limit for a long duration of time or that is extremely high above a specification limit for a short duration of time, e.g., due to Electrical Over Stress (EOS) or Electro-Static Discharge (ESD), or a Single Event Latch-up (SEL).

In various usage scenarios, on-chip supply transient drop and supply transient bump detection enables, for example, precise measurement of voltage variation on a chip, such as during testing a memory portion of the chip.

A supply transient drop and supply transient bump detector circuit (also referred to herein as a transient detector circuit) enables detection of supply transient drops and supply transient bumps. In some contexts, the supply transient drops and supply transient bumps correspond to power supply high peak current events. Examples of the power supply high peak current events include operating memory circuits, large IP circuits, and or one or more chip-level scan chains. As a specific example, a particular memory circuit of an integrated circuit operates with a self-timed clock (e.g., a few hundred picoseconds to a few nanoseconds). There are short-duration high-current power supply peaks at an edge of the self-timed clock (e.g., the rising edge), resulting in steep localized drops/bumps. A transient detector circuit enables detecting the steep localized drops/bumps, and is usable to diagnose failures (e.g., intermittent failures or hard failures) arising from them.

Further, detecting supply transient drops/bumps is usable in various usage contexts. An example usage context includes performing life-cycle monitoring of one or more portions of an integrated circuit, such as one or more IP blocks/modules of the integrated circuit. The life cycle monitoring is usable, e.g., for silicon life cycle management.

Another example usage context includes collecting supply transient drops/bumps information from systematically selected locations of an integrated circuit die. The collected information is then used to correlate against, validate, and/or improve accuracy of, e.g., power integrity simulation software and/or models used by the power integrity simulation software.

Another example usage context includes collecting supply transient drops/bumps information for failure analysis to facilitate debugging relating to power supply fluctuation.

Another example usage context includes continuously collecting supply transient drops/bumps information and continuously monitoring one or more portions of an integrated circuit (such as an IP block or module of the integrated circuit). The monitoring provides a warning of one or more detected transient voltage noise events that could be indicative of an eminent failure or a is indicative of a failure that has occurred. The monitoring enables recording information relating to a failure, such as when an integrated circuit fails prematurely.

Some specific examples follow. An example of a chip is an integrated circuit. An example of a supply is a power supply, including conductors that supply a VDD voltage and a VSS voltage, such as Digital VDD (DVDD) and Digital VSS (DVSS), as well as Analog VDD (AVDD) and Analog VSS (AVSS) to devices of an integrated circuit. As will be clear to those of ordinary skill in the art, in some contexts herein, the term 'power supply' is meant to refer generally to VDD as well as VSS, and in other contexts herein, the term 'power supply' is meant to refer to VDD and the term 'ground' is meant to refer to VSS.

An example of voltage noise is a collection of one or more voltage noise events. An example of a voltage noise event is an unexpected change in voltage away from a nominal value, followed by a return to the nominal value. Thus, the unexpected change is transient, and therefore the voltage noise event is also transient. The voltage noise event is either a decrease (referred to as a drop) or an increase (referred to as a bump). Thus, an example of a supply transient drop is an unexpected change in voltage below a nominal value, followed by a return to the nominal value, and an example of a supply transient bump is an unexpected change in voltage above a nominal value, followed by a return to the nominal value.

Voltage noise occurs on various conductors of an integrated circuit, such as conductors carrying logic signals, conductors carrying analog signals, conductors carrying power supply signals, and conductors carrying ground signals. Examples of power supply noise include voltage noise on power supply conductors, ground conductors, or both.

An example source of power supply noise is changing current through an inductor, sometimes termed "L di/dt" noise. The "L" represents inductance, the "di/dt" represents instantaneous rate of current change per unit time, and "L di/dt" collectively represents the resultant voltage change, as inductance multiplied by the instantaneous rate of current change per unit time determines the voltage change. Example sources of the inductance variously include an integrated circuit package and/or bonding thereof, as well as routing on a die of the integrated circuit. Example sources of the current change variously include switching currents (e.g., of some memory circuits) in addition to powering on/off IP blocks. Another example source of power supply noise is current-voltage (IR) drop from conductors, such as a grid of conductors carrying power or ground. Yet another example source of power supply noise is circuit activity concentrated in a localized area of an integrated circuit. Yet another example source of power supply noise is insufficient decoupling capacitors, such as in-package and/or on-die.

Yet another source of power supply noise is substrate noise. Some examples of sources of substrate noise are (1) coupling noise, (2) switching noise, and (3) impact ionization noise. The coupling noise is due, e.g., to coupling between the substrate and a digital supply. Power supply noise such as L di/dt noise and IR drop noise is coupled to the substrate via capacitive coupling and/or low resistance coupling. The switching noise is, e.g., due to transistor source/drain node switching currents capacitively coupled to the substrate, as well as gate switching capacitively coupled to the substrate. The impact ionization noise is, e.g., due to impact ionization occurring, for example, during fabrication that in turn leads to injection of substrate noise during circuit operation.

In some contexts, one or more of the foregoing power supply noise sources are relatively unpredictable by pre-manufacturing circuit simulation. As a specific example context, an operation of, e.g., a particular static random-access memory (SRAM) results in a voltage shrinking between DVDD and DVSS, such as when the particular SRAM is activated. The techniques disclosed herein enable measurements of the voltage shrinking. The measurements, in turn, enable improved predictability of the foregoing power supply noise sources, such as by using time-varying DVDD and DVSS during simulation.

Placing multiple instances of the transient detector circuit enables simultaneous detection of supply transient drops and supply transient bumps, e.g., by using a first instance to detect supply transient drops and by using a second instance to detect supply transient bumps. Placing multiple instances of the transient detector circuit enables simultaneous detection of transients on one or more power supply conductors and/or one or more ground conductors.

The transient detector circuit disclosed herein enables faster time to market via faster debug of potential issues related to power supply and/or power supply distribution elements (e.g., a power supply distribution network and/or grid) of an integrated circuit. The detector enables improvement in power integrity software accuracy by enabling comparing measurements made by the detectors of an integrated circuit with predictions made by integrated circuit design software. The detector enables safer product application with early warning of imminent and/or possible failure, such as beneficial for automotive and/or avionics applications. The detector enables future product improvement with postmortem information collected by the detectors in response to a failure.

The transient detector circuit disclosed herein is usable for detecting transient variations in a power supply (such as DVDD and DVSS) of an integrated circuit that are repetitive. The repetitiveness of the transient variations enables reduced bandwidth requirements for the transient detector circuit. A plurality of techniques, such as, using a plurality of reference voltage levels, using a comparator with hysteresis as controlled by a hysteresis value (e.g., $V_{HYS}$), using a plurality of hysteresis values (e.g., $V_{HYS1}$ and $V_{HYS2}$), performing a coarse hysteresis calibration according to a coarse hysteresis voltage ($V_{HYS1}$), and performing a fine hysteresis calibration according to a fine hysteresis voltage ($V_{HYS2}$), enable detecting the transient variations under a variety of operating conditions. The variety of operating conditions include operation of a static randomly accessible memory (SRAM) in a dense integrated circuit, operation of a dense register file of an integrated circuit, and operation of an intellectual property (IP) block of an integrated circuit.

Hysteresis voltages used for coarse and fine hysteresis calibrations are configurable, according to design constraints and/or supply drop minima and supply bump maxima. Using a same comparator (e.g., a multi-valued hysteresis comparator) for the coarse hysteresis calibration and the fine hysteresis calibration reduces power and area used for the transient detector circuit. Performing measurements over many clock cycles and/or increasing frequency of clocks of elements of the transient detector circuit enable counteracting randomness of transient drops and bumps.

Throughout this description and the figures, the term "coarse" is used with respect to, e.g., hysteresis, hysteresis value and/or voltage, and calibration interchangeably with the terms "first" and "initial" as well as the qualifier "[C]". Similarly, the term "fine" is used interchangeably with the terms "second" and "final" as well as the qualifier "[F]". As a first example, $V_{HYS1}$ is understood to refer to a hysteresis voltage applicable to a coarse calibration phase of operation. As a second example, $V_{HYS2}$ is understood to refer to a hysteresis voltage applicable to a fine calibration phase of operation. As a third example, two binary codes, corresponding respectively to $V_{REF}$[C] and $V_{REF}$[F], are understood to be produced respectively by the first calibration phase of operation and the second calibration phase of operation (that follows the first calibration phase of operation).

The transient detector circuit is further usable to provide information about the detected transient variations to one or more elements of the integrated circuit and/or an agent separate from the integrated circuit, e.g., by providing (directly and/or by multiplexing) results of the coarse and fine hysteresis calibrations using a dedicated set of pins coupled to the agent. The transient detector circuit is further usable in "stand alone" configurations (e.g., in an integrated circuit or in some other electronic device) using only power, ground, and clock resources.

An example component used in a transient detector circuit is a comparator, such as a comparator that operates with hysteresis. An example of a comparator is a hardware circuit usable to differentiate between two different signal levels. A comparator that operates without hysteresis differentiates between the two different signal levels according to a single threshold. As a specific example, consider a voltage comparator that operates without hysteresis and a single threshold voltage of 2.5V. Responsive to an input ramping from 0V to 5V, when the input crosses 2.5V (equal to the comparator threshold voltage), the output of the comparator switches, e.g., from 0V to 5V. Responsive to the input ramping from 5V to 0V, when the input crosses 2.5V (equal to the comparator threshold voltage), the output of the comparator switches, e.g., from 5V to 0V. If there is noise on the input as it crosses the 2.5V comparator threshold voltage, then the comparator output switches multiple times, according to the noise.

A comparator that operates with hysteresis differentiates between the two different signal levels according to a plurality of thresholds (e.g., two thresholds). In a context of two thresholds, the difference between the two thresholds is referred to as the hysteresis of the comparator. As a specific example, consider a voltage comparator that operates with a first (low) input threshold of 2V and a second (high) input threshold of 3V. The hysteresis is the difference between the two thresholds: in this specific example, 1V. Responsive to an input ramping from 0V to 5V, when the input crosses 3V (equal to the comparator high input threshold voltage), the output of the comparator switches, e.g., from 0V to 5V. The output of the comparator remains at 5V until the input crosses the comparator low input threshold voltage (2V). Responsive to the input ramping from 0V to 5V, when the input crosses 2V (equal to the comparator low input threshold voltage), the output of the comparator switches, e.g., from 5V to 0V. The output of the comparator remains 0V until the input crosses the comparator high input threshold voltage (3V). Thus, the comparator with hysteresis provides noise immunity. A larger hysteresis corresponds to higher noise immunity.

Returning to the transient detector circuit in its entirety, compared to other techniques, the transient detector circuit avoids expense and circuit loading (e.g., capacitive loading) associated with providing real-time signal outputs of an integrated circuit.

The transient detector circuit is not limited to determining whether a supply is above (or below) a specific voltage threshold, as in a latched-based comparator technique. The transient detector circuit is not limited to a speed of operation of a comparator circuit, as in a threshold detection-based comparator circuit. The transient detector circuit is insensitive to a comparator offset characteristic leading to a systematic error in a threshold detection level that in turn leads to a clock and/or timing skew in the threshold detection, as in other techniques. The transient detector circuit is insensitive to comparator delay and/or variances thereof, such as due to thermal and/or flicker noise, e.g., leading to jitter expressible as input-referred voltage noise, as in other techniques.

Regarding the transient detector circuit described herein, providing control of comparator hysteresis enables detection of larger transient drops and bumps, e.g., on power supply lines, such as DVDD and/or on ground supply lines, such as DVSS. Increasing the comparator hysteresis, e.g., increasing $V_{HYS}$, enables avoiding detection of short transitions, if desired. Controlling $V_{HYS}$ enables removing undesired output from the comparator and determining an accurate measurement of an internal supply and/or ground voltage.

In a usage context where the transient detector circuit is powered by an analog supply, the transient variations are detectable over the full range of the analog supply, e.g., rail-to-rail. For example, a DVSS drop to as low as the analog supply VSS is measurable, and a DVDD bump to as high as the analog supply VDD is measurable. The rail-to-rail operation is enabled, in part, using a comparator circuit that is operable with the full analog supply voltage swing, e.g., rail-to-rail. The rail-to-rail operation enables wide common mode ranges and variation thereof.

The transient detector circuit is enabled to provide accurate information about transients even as voltage scales downward with technology, including transient events during high-frequency memory read operations. An integrated circuit that includes the transient detector circuit is enabled to indicate detection of transient events to one or more elements of the integrated circuit and/or an agent separate from the integrated circuit via one or more pins (e.g., dedicated or shared) and without operating the integrated circuit in a special test mode, thus enabling indication of detected transit events without connection to or operation of a scan chain. The transient detector circuit is operable using a test clock to provide sufficient timing information. Thus, there is no need for delayed or differential clock phases or clock pulses, and consequently there is no requirement for a delay lock loop or similar circuitry. The transient detector circuit is operable without using subsampling, thus avoiding performance degradation due to using, e.g., a digital sampling oscilloscope. The transient detector circuit is operable without using a sample-and-hold tracking circuit.

In operation, a voltage measurement of a transient is performed in part using a comparator operable in accordance with a configurable and/or selectable hysteresis voltage, such as a multi-valued hysteresis comparator. A coarse calibration is followed by a fine calibration, each according to a respective hysteresis voltage. The coarse calibration enables usage in contexts with relatively large transients and following the coarse calibration with a fine calibration enables precise measurements in all contexts, including those with relatively large transients. The transient detector circuit uses a binary search technique based on a successive approximation register (SAR) to select the reference voltages for the coarse calibration and the fine calibration. In some usage contexts, the coarse calibration hysteresis voltage is optionally kept at a relatively high level to avoid smaller transitions or noise during the coarse calibration. In some usage contexts, the coarse calibration hysteresis voltage is optionally further adjusted, enabling measuring larger supply bump or smaller switching noise transitions. In some cases, controlling the coarse calibration hysteresis voltage enables reduction or elimination of voltage noise fluctuation.

The fine calibration is performed in part using a binary to thermometric decoder circuit. In some usage contexts, the fine calibration enables a measurement of nearly the maximum of a bump and the minimum of a drop by use of the fine calibration hysteresis voltage, as the coarse calibration technique has avoided smaller drops and bumps before beginning the fine calibration. An enable (EN) control signal enables smooth control of the hysteresis voltage during the fine calibration. A minimum error code detector is configured to set voltage so that during the fine calibration, a next operation is analog subtraction. The analog subtraction is implementable, e.g., using two cascode devices.

In some example usage scenarios of a transient detector circuit, multiple clock phases are generated, and each is used to clock a respective instance of a transient detector circuit or portion thereof (such as a multi-valued hysteresis comparator). The phases are generatable, e.g., using a frequency locking technique. For example, phases are generated at $$\frac{2\pi}{2^n}$$

degrees (where n is a positive integer). Each respective phase is used to clock a respective instance of a transient detector circuit. Each of the transient detector circuits is configured to sample a particular (same) conductor (e.g., a DVDD conductor or a DVSS conductor). The transient detector circuits are collectively controlled to perform a subsampling measurement of the particular conductor, enabling measuring instantaneous random noise on the particular conductor and/or enabling adjusting hysteresis values, such as in a subset of comparators of the transient detector circuits.

FIG. 1A illustrates a system that performs on-chip supply transient drop and supply transient bump detection on an integrated circuit.

More specifically, FIG. 1A illustrates a system including Device Under Test (DUT) 101 to perform the on-chip supply transient drop and supply transient bump detection and to provide information thereof to Measurement Environment 100, e.g., for storage into Database 105.

DUT 101 includes Transient Detector Circuit 102 that in turn includes Multi-Valued Hysteresis Comparator 106. Multi-Valued Hysteresis Comparator 106 is enabled to receive information via Input 107, Reference 108, and Hysteresis 109, and in dependence on the received information, provides comparison results on Output 110 that in conjunction with other circuitry of Transient Detector Circuit 102 (illustrated, e.g., in FIG. 2A), detect a transient drop or bump. Generally, Multi-Valued Hysteresis Comparator 106 compares Input 107 with Reference 108 according to Hysteresis 109. The other circuitry (not illustrated) controls Input 107, Reference 108, and Hysteresis 109 as well as observes Output 110. The other circuitry operates, e.g., Multi-Valued Hysteresis Comparator 106 according to two phases of operation. The phases of operation include a first/coarse calibration according to a coarse hysteresis indication provided on Hysteresis 109, followed by a final/fine calibration according to a fine hysteresis indication provided on Hysteresis 109.

In some examples, Transient Detector Circuit 102 is enabled to provide, and Interface Circuitry 103 is enabled to receive, a multi-bit multiplexed interface providing a result of a coarse calibration for a first time interval followed by a result of a fine calibration for a second time interval. For example, the first time interval begins in dependence on completion of the coarse calibration and the second time interval begins in dependence on completion of the fine calibration.

Measurement Environment 100 is coupled to DUT 101 to receive information derived from Output 110 of Multi-Valued Hysteresis Comparator 106 of Transient Detector Circuit 102. Measurement Environment 100 provides an interface to the instance of Transient Detector Circuit 102 via included Interface Circuitry 103, coupled to drive and to receive information from Transient Detector Circuit 102. Measurement Environment 100 also includes Control 104 that collects the information from Interface Circuitry 103 and selectively stores the information in Database 105. For clarity, couplings to DUT 101 relating to operations not related to Transient Detector Circuit 102 are omitted.

In some usage examples, multiple instances of Transient Detector Circuit 102 are physically distributed in DUT 101 to enable detection of supply transient drops and supply transient bumps, such as a local transient drop on DVDD or a local transient bump on DVSS, enabling detection of localized failures of Vmin and/or a maximum voltage (Vmax) specifications. In some usage examples, multiple instances of Transient Detector Circuit 102 are included in DUT 101 to enable simultaneous detection of supply transient drops and supply transient bumps and/or to enable simultaneous detection of transients on one or more power supply conductors and/or one or more ground conductors.

Partitioning of functionality of Measurement Environment 100 (e.g., Interface Circuitry 103 and/or Control 104) and/or Database 105 as illustrated in the figure is exemplary only. For example, all or any portions of functionality of Measurement Environment 100 (e.g., Interface Circuitry 103 and/or Control 104) and/or Database 105 are performed in whole or in part by one or more elements of circuitry included in DUT 101. As one specific example, Measurement Environment 100 and/or Database 105 are included as elements of DUT 101. In some usage scenarios, all, or any portions of functionality of Measurement Environment 100 (e.g., Interface Circuitry 103 and/or Control 104) and/or Database 105 are performed by an integrated circuit tester.

Figure 7:
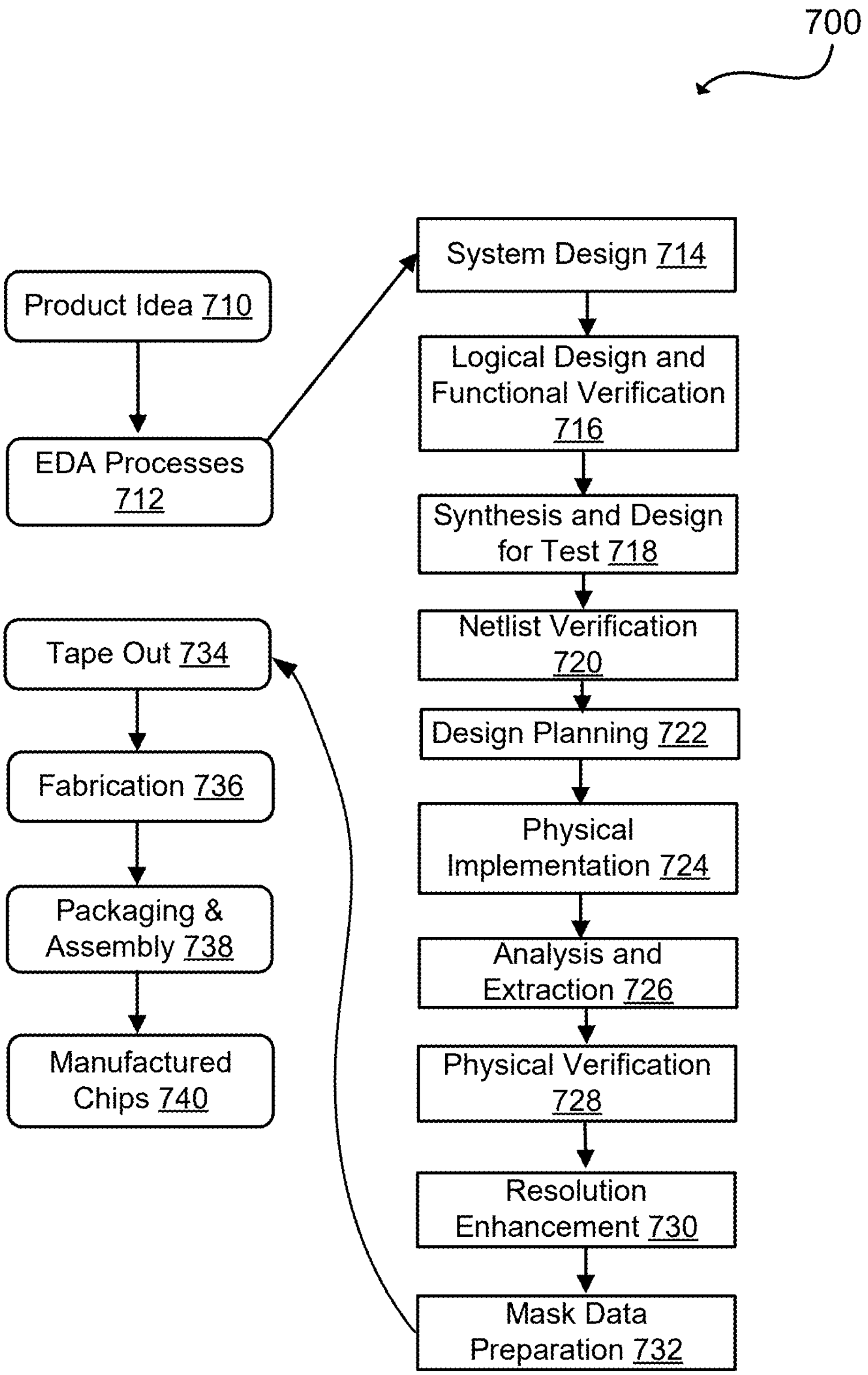
FIG. 7 depicts a flowchart of various processes used during the design and manufacture of an integrated circuit in accordance with some embodiments of techniques to perform on-chip supply transient drop and supply transient bump detection on an integrated circuit and to provide information thereof to one or more elements of the integrated circuit and/or an agent separate from the integrated circuit.

In some examples, DUT 101 corresponds to a chip as manufactured according to the finished integrated circuit as manufactured chips 740 of FIG. 7.

Figure 1B:
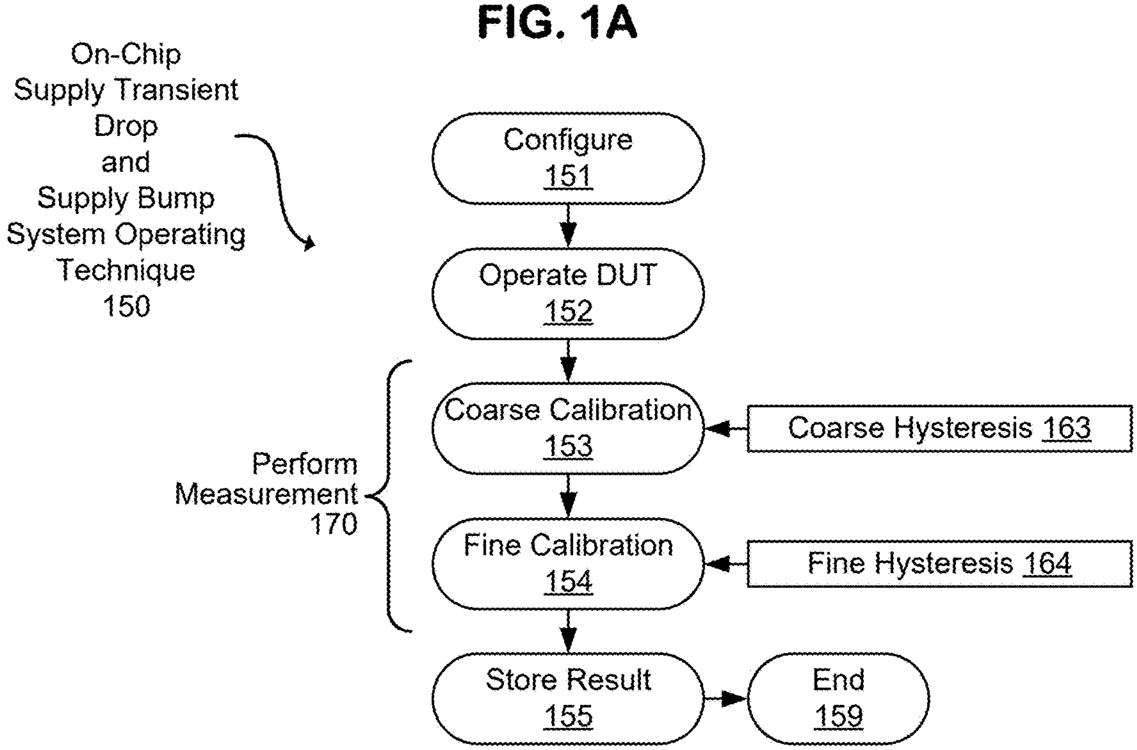
FIG. 1B illustrates an example technique for operating a system that detects and provides indications of transient supply drops and transient supply bumps on an integrated circuit.

FIG. 1B illustrates an example technique for operating a system enabled to detect and provide indications of transient supply drops and transient supply bumps on an integrated circuit.

More specifically, FIG. 1B illustrates an example technique for operating the system illustrated in FIG. 1A as On-Chip Supply Transient Drop and Supply Bounce System Operating Technique 150. The technique begins by performing various initialization operations (Configure 151). Examples of the initialization operations include setting up Interface Circuitry 103 (FIG. 1A), Control 104 (FIG. 1A), and Database 105 (FIG. 1A) for operation, such as by programming Interface Circuitry 103 and/or Control 104 with information specific to DUT 101 and/or measurement parameters (e.g., whether to perform a drop or a bump measurement, whether to perform a measurement of a DVSS conductor or a DVDD conductor, which of an optional plurality of DVDD conductors and/or DVSS conductors to perform a measurement of, values for coarse and/or fine calibration operation, and/or values for coarse and/or fine hysteresis). Further examples of the initialization operations include preparing Database 105 for receiving information relating to indicators of results of the measurement as performed by Transient Detector Circuit 102 of DUT 101.

The technique proceeds by operating DUT 101, including operating Transient Detector Circuit 102 according to the measurement parameters (Operate DUT 152), such as by applying power, configuring circuitry of Transient Detector Circuit 102 (e.g., such as by selecting a bump or a drop measurement, selecting a DVSS or a DVDD measurement, selecting which of an optional plurality of DVDD conductors and/or DVSS conductors to perform a measurement of, and configuring calibration operation and/or hysteresis values), driving inputs, and receiving outputs for a specific operating and/or usage context.

Responsive to a request to detect an on-chip supply transient drop and/or an on-chip supply transient bump, Transient Detector Circuit 102 is operated (Perform Measurement 170). Then the technique proceeds to save information about the measurement (Store Result 155), e.g., by storing the information in Database 105, such as by using capabilities of Interface Circuitry 103 and/or Control 104. The technique is then complete (End 159).

Perform Measurement 170 includes two operations performed one after the other, a first operation for an initial/coarse calibration (Coarse Calibration 153), and second operation for a final/fine calibration (Fine Calibration 154). The two elements are performed, e.g., by a same comparator, such as Multi-Valued Hysteresis Comparator 106 (FIG. 1A). Multi-Valued Hysteresis Comparator 106 is operable according to one or more hysteresis values, an initial/coarse value, Coarse Hysteresis 163 (for Coarse Calibration 153), and a final/fine value, Fine Hysteresis 164 for (Fine Calibration 154).

Figure 8:
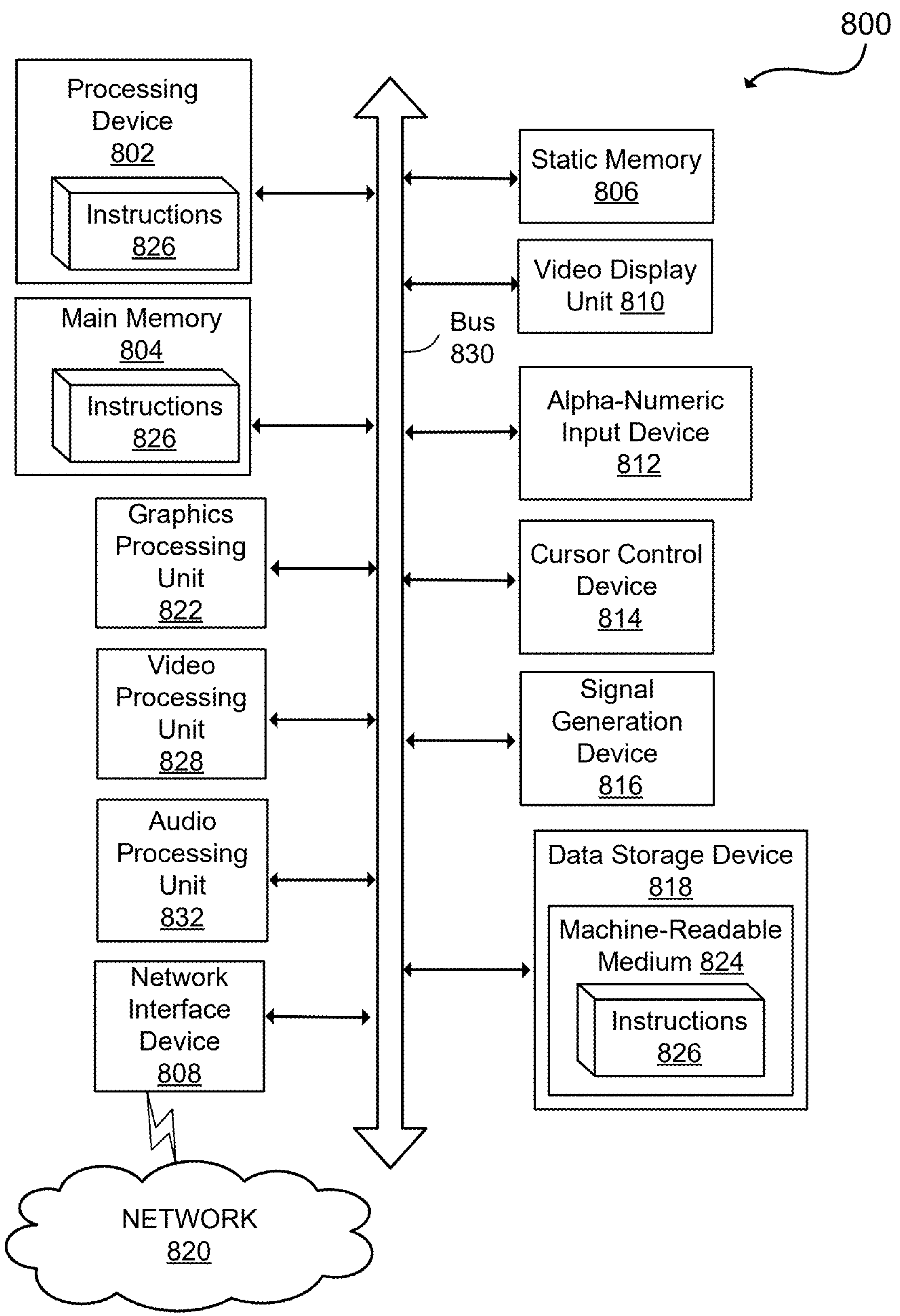
FIG. 8 depicts a diagram of an example computer system in which techniques to perform on-chip supply transient drop and supply transient bump detection on an integrated circuit and to provide information thereof to one or more elements of the integrated circuit and/or an agent separate from the integrated circuit may operate, and/or techniques to design and manufacture the integrated circuit may operate.

In some examples, On-Chip Supply Transient Drop and Supply Bounce System Operating Technique 150 is performed under control of a computer system, such as the computer system 800 of FIG. 8.

Figure 2A:
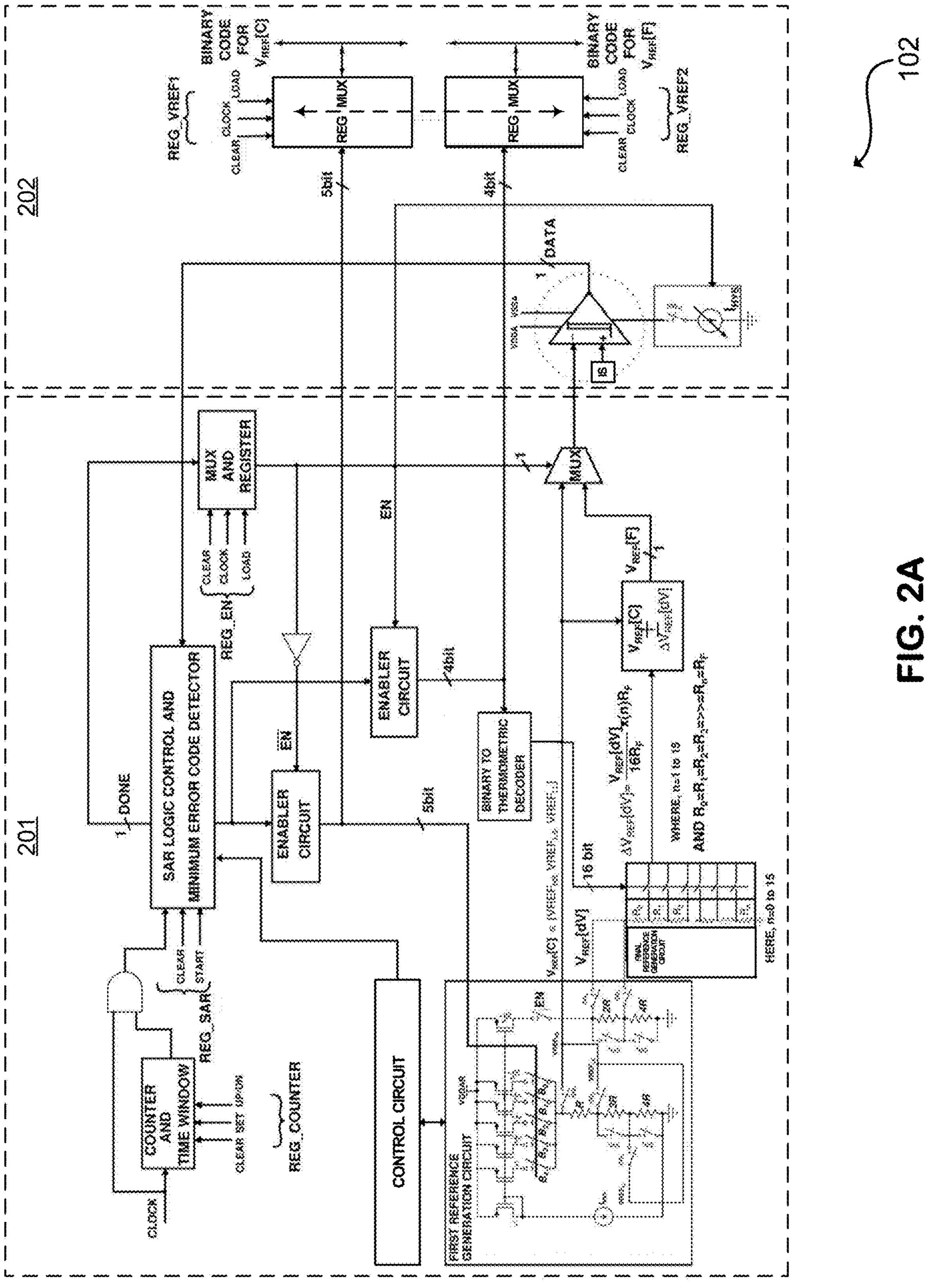
FIG. 2A illustrates an example circuit that detects supply transient drops and supply transient bumps on an integrated circuit.

A brief overview FIGS. 2A, 2A1, 2A2, 2A3, 2A4, and 2A5 follows and is in turn followed by a description of operation of the elements of those figures. As the brief overview, FIGS. 2A, 2A1, 2A2, 2A3, 2A4, and 2A5 are illustrative of various portions of a same example circuit enabled to detect supply transient drops and supply transient bumps on an integrated circuit and to provide indications thereof to an agent separate from the integrated circuit. More specifically, FIG. 2A is a starting view, FIGS. 2A1 and 2A2 are increased-scale views of FIG. 2A, and FIGS. 2A3, 2A4, and 2A5 are further increased-scale views of selected elements of FIGS. 2A1 and 2A2.

FIG. 2A illustrates an example circuit that detects supply transient drops and supply transient bumps on an integrated circuit.

More specifically, FIG. 2A illustrates an example circuit enabled to detect supply transients on an integrated circuit and to provide indications of the detected supply transients to an agent separate from the integrated circuit. Examples of the supply transients include supply transient drops and supply transient bumps, such as on DVSS conductors and/or DVDD conductors of the integrated circuit. All or any portions of elements illustrated in FIG. 2A collectively are an example implementation of Transient Detector Circuit 102 of FIG. 1A. The elements illustrated in FIG. 2A are partitioned, solely for convenience of illustration, into two portions, left-hand portion 201 and right-hand portion 202.

FIG. 2A1 illustrates the enlarged left-hand portion of FIG. 2A.

More specifically FIG. 2A1 illustrates left-hand portion 201 of FIG. 2A. Included (among other elements) in left-hand portion 201 are Control Circuit 203, SAR Logic Control and Minimum Error Code Detector 204, Done 208, Mux and Register 209, Coarse/Initial Reference Generation Circuit 210, and Fine/Final Reference Generation Circuit 220.

FIG. 2A2 illustrates the enlarged right-hand portion of FIG. 2A.

More specifically FIG. 2A2 illustrates right-hand portion 202 of FIG. 2A. Included (among other elements) in right-hand portion 202 are Reg/Mux 240, Input Selector (IS) 230, Multi-Valued Hysteresis Comparator 106, Input 107, Reference 108, Hysteresis 109, Output 110, and Variable Hysteresis Current Source 250. Couplings between left-hand portion 201 and right-hand portion 202 are illustrated as elements 291-295 in each of FIG. 2A1 and FIG. 2A2.

FIG. 2A3 illustrates Coarse/Initial Reference Generation Circuit 210 of FIG. 2A1, including Coarse Reference Network elements 211A, 211B, and 211C, referred to collectively herein as Coarse Reference Network 211.

FIG. 2A4 illustrates Fine/Final Reference Generation Circuit 220 of FIG. 2A1, including Fine Reference Network 221.

Figure 5:
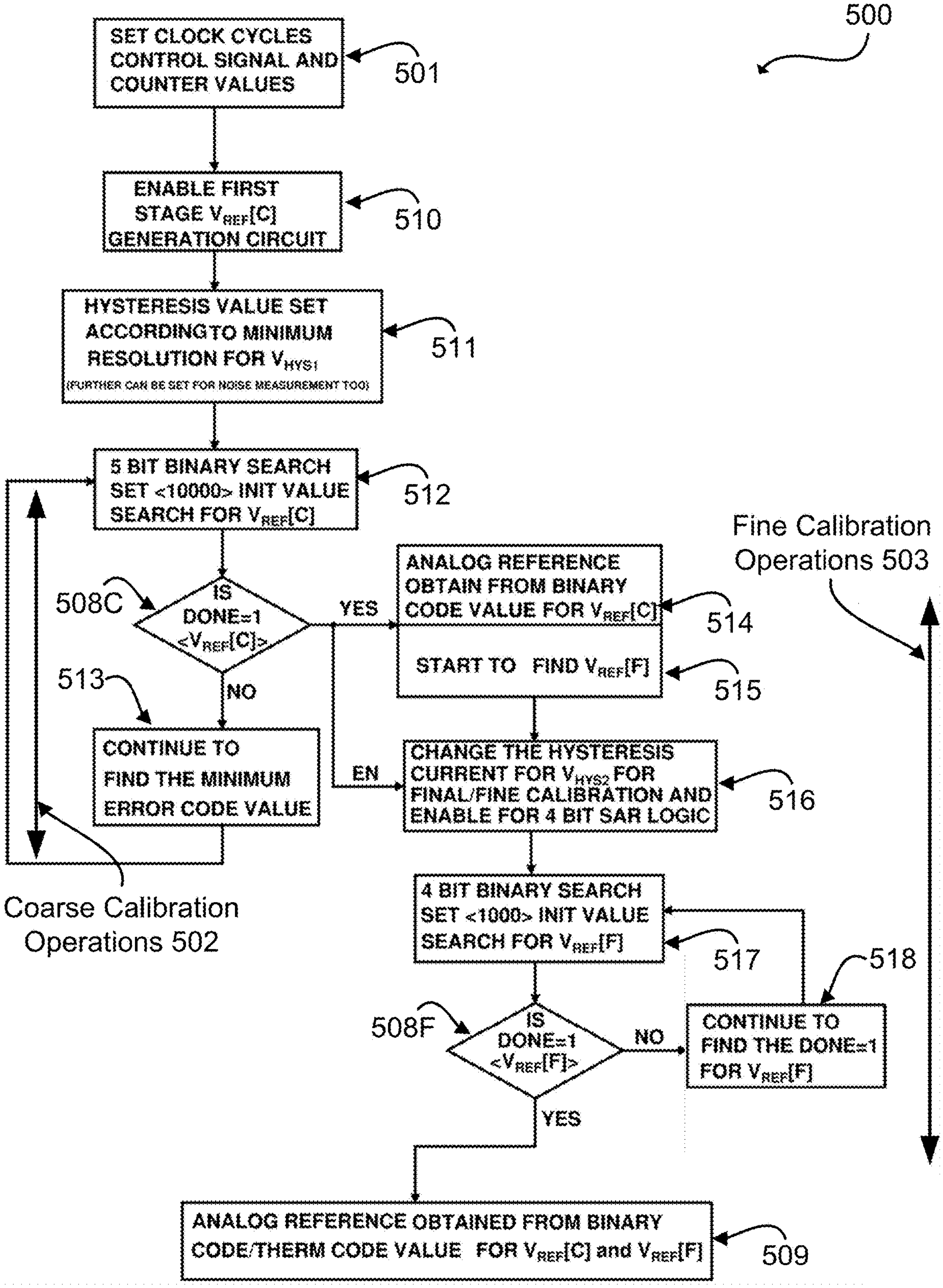

FIG. 2A5 illustrates Variable Hysteresis Current Source 250 of FIG. 2A2.

Having completed the brief overview of FIGS. 2A, 2A1, 2A2, 2A3, 2A4, and 2A5, what follows is a description of operation of the elements of those figures, to be understood in conjunction with any one or more of those figures.

Control of overall operation of Transient Detector Circuit 102 (FIG. 1A and FIG. 2A) is generally performed by Control Circuit 203 (FIG. 2A1) coupled to SAR Logic Control and Minimum Error Code Detector 204 (FIG. 2A1) and Coarse/Initial Reference Generation Circuit 210 (FIG. 2A1 and FIG. 2A3). There are other couplings between Control Circuit 203 and other elements of Transient Detector Circuit 102 (that are not illustrated for clarity). Multi-Valued Hysteresis Comparator 106, via Output 110 (FIG. 1A and FIG. 2A2), provides comparator results to SAR Logic Control and Minimum Error Code Detector 204 (FIG. 2A1). The comparator results are usable to determine control of switches of Coarse/Initial Reference Generation Circuit 210 during coarse calibration. The switches of Coarse/Initial Reference Generation Circuit 210 in turn control included Coarse Reference Network 211 (e.g., a first reference network) that includes a plurality of resistors and a plurality of transistors to develop a coarse/initial reference voltage. The comparator results are further usable to determine control of switches of Fine/Final Reference Generation Circuit 220 via Thermometric Decoder 205 (FIG. 2A1) during fine calibration. The switches of Fine/Final Reference Generation Circuit 220 in turn control included Fine Reference Network 221 (e.g., a second reference network) that includes a plurality of resistors and a plurality of transistors to develop a fine/final reference voltage. Control and Minimum Error Code Detector 204 indicates completion of a calibration phase (e.g., a coarse calibration phase or a fine calibration phase), such as based on finding a minimum error code value, via Done 208 (FIG. 2A1).

Operation begins by selecting a source to measure. Circuitry of IS 230 (FIG. 2A2) is directed to select either a ground conductor (e.g., to measure DVSS) or a power conductor (e.g., to measure DVDD) as Input 107 (FIG. 1A and FIG. 2A2) of Multi-Valued Hysteresis Comparator 106 (FIG. 1A and FIG. 2A2). Optionally, the selection is made from one of a plurality of ground conductors and/or one of a plurality of power conductors.

In a first (e.g., coarse) phase of calibration operation, Coarse/Initial Reference Generation Circuit 210, in conjunction with successive approximation directed by SAR Logic Control and Minimum Error Code Detector 204 and comparisons performed with hysteresis by Multi-Valued Hysteresis Comparator 106, performs a coarse calibration to produce a 5-bit coarse measurement provided as Binary Code for $V_{REF}$[C], such as conveyed via element 292 (FIG. 2A1 and FIG. 2A2) and captured by Reg/Mux 240 (FIG. 2A2). The 5-bit coarse measurement conveyed via element 292 is used to control $B_4$-$B_0$ of Coarse/Initial Reference Generation Circuit 210.

In a second (e.g., fine) phase of calibration operation, following the first phase of calibration operation, Fine/Final Reference Generation Circuit 220 (FIG. 2A1 and FIG. 2A4), in conjunction with SAR Logic Control and Minimum Error Code Detector 204 and Binary to Thermometric Decoder 205, along with comparisons performed with hysteresis by Multi-Valued Hysteresis Comparator 106, performs a fine calibration to produce a 4-bit fine measurement provided as Binary Code for $V_{REF}$[F], such as conveyed via element 294 (FIG. 2A1 and FIG. 2A2). Then, the $V_{REF}$[C] and the $V_{REF}$[F] binary codes are provided, e.g., on dedicated pins or alternatively multiplexed on shared pins DUT of 101 (FIG. 1A) to Measurement Environment 100 (FIG. 1A).

During the coarse calibration, Analog Multiplexer 207 (FIG. 2A1) selects an output of Coarse/Initial Reference Generation Circuit 210 as Reference 108 (FIG. 1A and FIG. 2A2) for comparison by Multi-Valued Hysteresis Comparator 106. The comparison is according to a coarse hysteresis value, such as provided by Variable Hysteresis Current Source 250 (FIG. 2A2) to Hysteresis 109 (FIG. 1A and FIG. 2A2). During the fine calibration, Analog Multiplexer 207 selects Analog Compute Circuit 206 (that performs a subtraction of an output of Fine/Final Reference Generation Circuit 220 and $V_{REF}$[C]) as Reference 108 for comparison by Multi-Valued Hysteresis Comparator 106. The comparison is according to a fine hysteresis voltage, such as determined by Variable Hysteresis Current Source 250 via Hysteresis 109.

Figure 6:
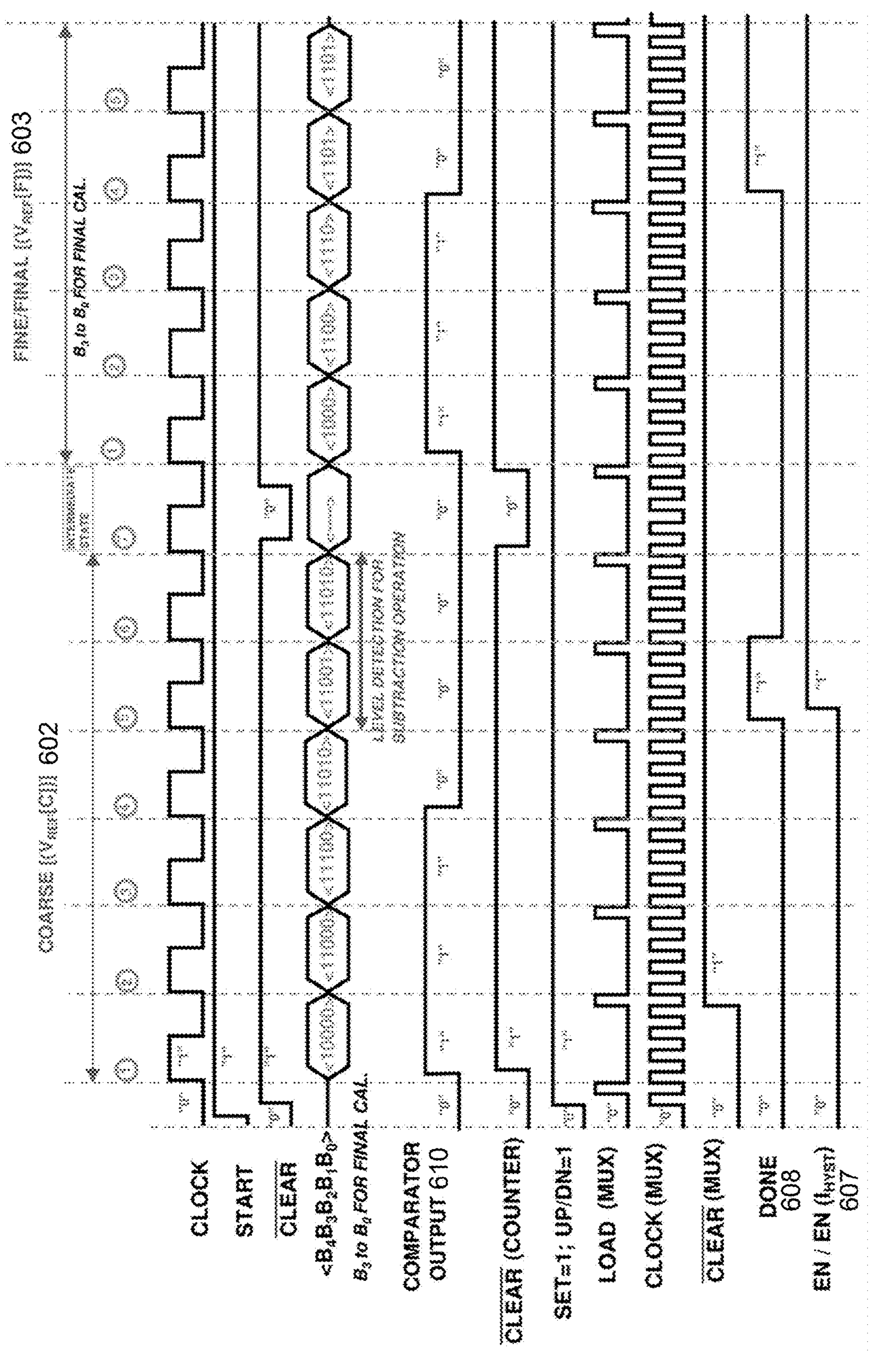

FIG. 2A6 illustrates Multi-Value Hysteresis Current Source 251.

More specifically, FIG. 2A6 illustrates Multi-Value Hysteresis Current Source 251 usable instead of or in addition to Variable Hysteresis Current Source 250 to provide a selected one of two currents usable to determine respectively a coarse and a fine hysteresis voltage for comparator operation.

Figure 3A:
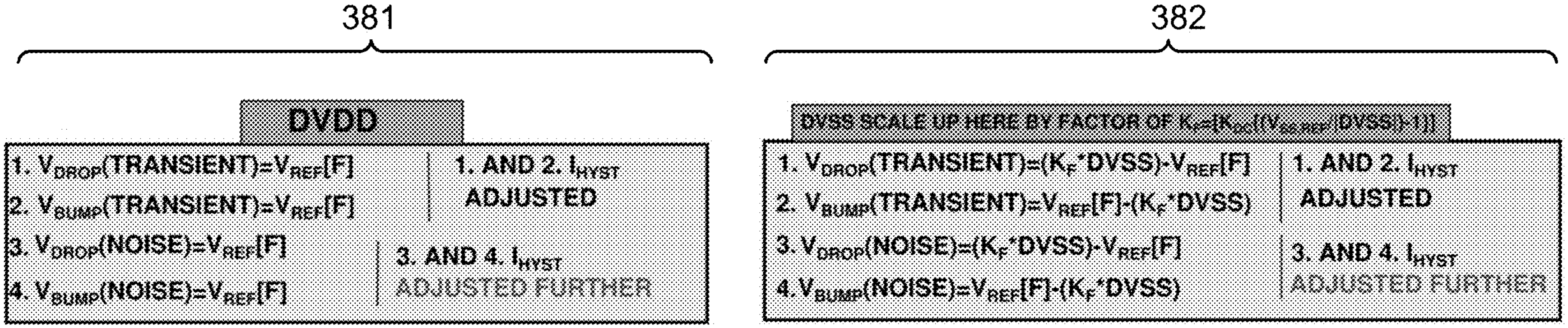
FIG. 3A illustrates selected information related to performing supply transient detections (e.g., measurements) of digital voltage supply (DVDD) and digital ground supply (DVSS).

FIG. 3A illustrates selected information related to performing supply transient detections (e.g., measurements) of DVDD and DVSS.

More specifically, FIG. 3A illustrates selected information related to performing supply transient measurements of DVDD as DVDD Measurement Technique 381, and selected information related to performing supply transient measurements of DVSS as DVSS Measurement Technique 382.

Figure 3B:
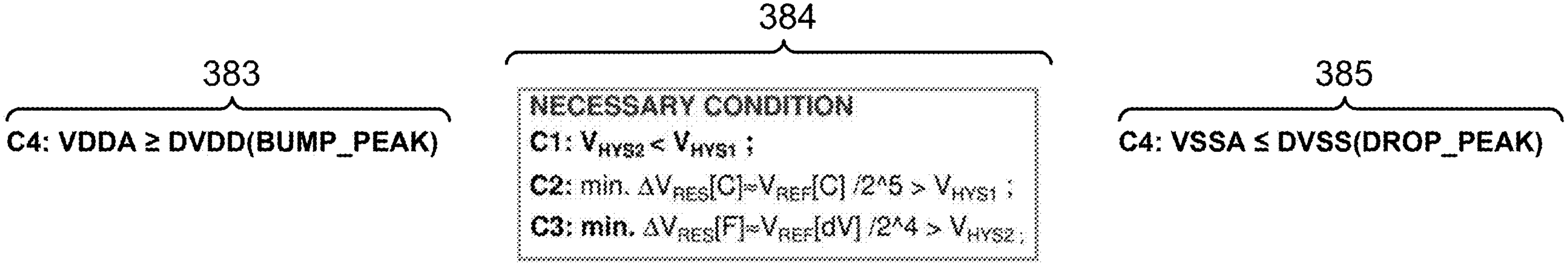
FIG. 3B illustrates selected conditions related to performing supply transient measurements of DVDD and DVSS.

FIG. 3B illustrates selected conditions related to performing supply transient measurements of DVDD and DVSS.

More specifically, FIG. 3B illustrates selected conditions related to performing supply transient measurements of DVDD as DVDD Measurement Conditions 383, selected conditions related to performing supply transient measurements of DVSS as DVSS Measurement Conditions 385, and selected conditions related to performing supply transient measurements of either of DVSS or DVSS as DVDD/DVSS Measurement Conditions 384.

Each of FIGS. 4A, 4B, 4C, and 4D illustrate a respective detection of a transient event. Collectively four cases are covered, DVSS and DVDD events in combination with drop and bump events. With respect to FIGS. 4A, 4B, 4C, and 4D, recall that the transient detector circuit disclosed herein is usable for detecting transient variations that are repetitive. Therefore, in the following description regarding DVSS/DVDD drops/bumps waveforms and detections thereof, it is understood that each of FIGS. 4A, 4B, 4C, and 4D is conceptual in nature, representing a multitude of repetitions of a particular supply transient (as a voltage in the Y axis versus time in the X axis) as applied to Input 107 (FIG. 1A and FIG. 2A2) of Multi-Valued Hysteresis Comparator 106 (FIG. 1A and FIG. 2A2).

Figures 4A, 4B, 4C, 4D:
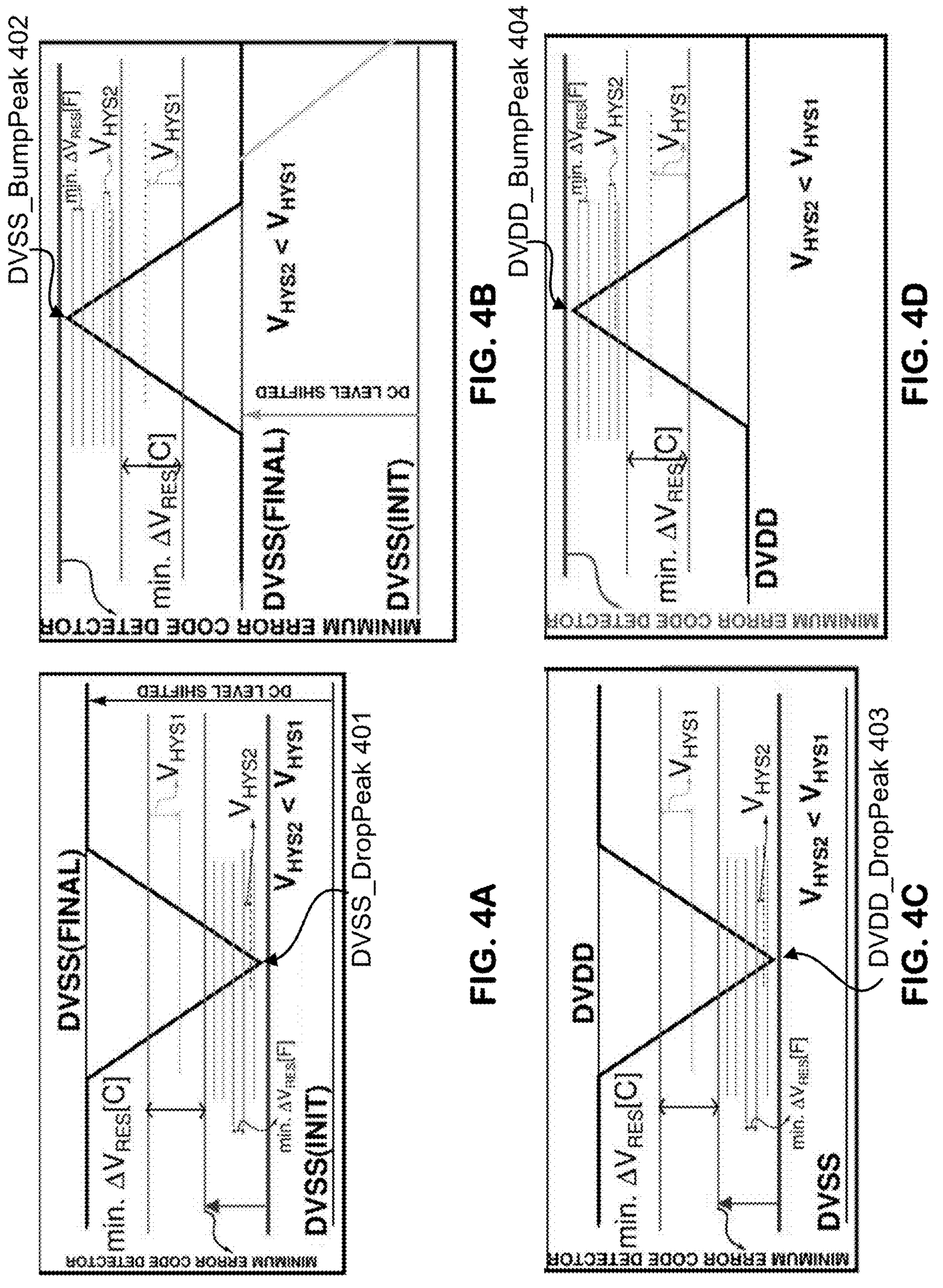
FIG. 4A illustrates detection of a DVSS drop.
FIG. 4B illustrates detection of a DVSS bump.
FIG. 4C illustrates detection of a DVDD drop.
FIG. 4D illustrates detection of a DVDD bump.

FIG. 4A illustrates detection of a DVSS drop.

More specifically, FIG. 4A illustrates a DVSS drop and detection thereof using Transient Detector Circuit 102. The lowest point of the detected DVSS drop is indicated by DVSS_DropPeak 401.

FIG. 4B illustrates detection of a DVSS bump.

More specifically, FIG. 4B illustrates a DVSS bump and detection thereof using Transient Detector Circuit 102. The highest point of the detected DVSS bump is indicated by DVSS_BumpPeak 402.

In each of FIGS. 4A and 4B, initial and final DVSS voltages, corresponding to pre and post DC level shifting are illustrated.

FIG. 4C illustrates detection of a DVDD drop.

More specifically, FIG. 4C illustrates a DVDD drop and detection thereof using Transient Detector Circuit 102. The lowest point of the detected DVDD drop is indicated by DVDD_DropPeak 403.

FIG. 4D illustrates detection of a DVDD bump.

More specifically, FIG. 4D illustrates a DVDD bump and detection thereof using Transient Detector Circuit 102. The highest point of the detected DVDD bump is indicated by DVDD_BumpPeak 404.

Further illustrated in each of FIG. 4A-4D (in addition to the DVSS/DVDD waveforms and respective drops/bumps applied to Input 107) are hysteresis values for each of the coarse and the fine calibration operations (respectively as voltages $V_{HYS1}$ and $V_{HYS2}$) as well as minimum differences resolvable for each of the coarse and the fine calibration operations (respectively as voltages $\Delta V_{RES}$[C] and $\Delta V_{RES}$[F]). Further illustrated in each of FIG. 4A-4D is a voltage corresponding to operation of a minimum error code detector, such as included in SAR Logic Control and Minimum Error Code Detector 204 (FIG. 2A1).

For clarity, Output 110 (FIG. 1A and FIG. 2A2) of Multi-Valued Hysteresis Comparator 106 is omitted in each of FIGS. 4A-4D, since for each of the multitude of repetitions of a particular supply transient that each of the figures represent, the time at which Output 110 transitions differs based on changes to Reference 108 (FIG. 1A and FIG. 2A2) corresponding to progression of a calibration. For example, during the coarse calibration operation, an output of Coarse/Initial Reference Generation Circuit 210 (FIG. 2A1 and FIG. 2A3) is used as a basis for Reference 108 for comparison by Multi-Valued Hysteresis Comparator 106, and the output changes as the coarse calibration operation proceeds iteratively. For another example, during the fine calibration operation, an output of Fine/Final Reference Generation Circuit 220 (FIG. 2A1 and FIG. 2A4) is used in part to determine Reference 108 for comparison by Multi-Valued Hysteresis Comparator 106, and the output changes as the fine calibration operation proceeds iteratively.

FIG. 5 illustrates an example flow diagram for detecting supply transients.

More specifically, FIG. 5 illustrates Supply Transient Flow Diagram 500 (for detecting supply transients, such as drops or bumps on DVDD or DVSS conductors) as performed, e.g., by operation of Transient Detector Circuit 102. Control of operations illustrated in FIG. 5 is performed, e.g., by Control Circuit 203 (FIG. 2A1) such as in conjunction with SAR Logic Control and Minimum Error Code Detector 204 (FIG. 2A1), Coarse/Initial Reference Generation Circuit 210 (FIG. 2A1 and FIG. 2A3), and/or Fine/Final Reference Generation Circuit 220 (FIG. 2A1 and FIG. 2A4). Overall, operation begins at operation 501 by initializing various control-related information, and concludes at operation 509 with values obtained for $V_{REF}$[C] and $V_{REF}$[F], corresponding respectively, to results of Coarse Calibration Operations 502 and Fine Calibration Operations 503.

In further detail, after operation 501, operation 510 enables Coarse/Initial Reference Generation Circuit 210. Operation 511 sets an initial value for Hysteresis 109 (FIG. 1A and FIG. 2A2) appropriate to coarse operation. Operation 512 uses SAR Logic Control and Minimum Error Code Detector 204 to perform an iteration of successive approximation according to a 5-bit approximation technique. Operation 508C examines results of the successive approximation iteration. Responsive to more iterations needed, the flow loops back via operation 513 to perform another iteration at operation 512. (Coarse Calibration Operations 502 includes operations 512, 508C, and 513.) Responsive to iterations completed, flow continues to operation 514 with $V_{REF}$[C]) determined.

Operation 515 enables Fine/Final Reference Generation Circuit 220, using $V_{REF}$[C]) initially as input to Reference 108 (FIG. 1A and FIG. 2A2). Operation 516 sets an initial value for Hysteresis 109 appropriate to fine operation. Operation 517 uses SAR Logic Control and Minimum Error Code Detector 204 to perform an iteration of successive approximation according to a 4-bit approximation technique. Operation 508F examines results of the successive approximation iteration. Responsive to more iterations needed, flow loops back via operation 518 to perform another iteration at operation 517. (Fine Calibration Operations 502 includes operations 517, 508F, and 518.) Responsive to iterations completed, flow continues to operation 509 with $V_{REF}$[F]) determined, as well as $V_{REF}$[F](from Coarse Calibration Operations 502). In some contexts, $V_{REF}$[C]) is referred to as a first voltage value and $V_{REF}$[F]) is referred to as a second voltage value.

For an example of operation, Coarse Calibration Operations 502 are performed by Control Circuit 203 in conjunction with SAR Logic Control and Minimum Error Code Detector 204 and Coarse/Initial Reference Generation Circuit 210. Continuing with the example, at operation 508C, assertion of Done 208 (FIG. 2A1) indicates the "Yes" path. For another example, Operation 515 is performed in part using information from $V_{REF}$[C](e.g., four most significant bits as determined by Coarse/Initial Reference Generation Circuit 210 in conjunction with SAR Logic Control and Minimum Error Code Detector 204) to initialize operation of Fine/Final Reference Generation Circuit 220. For another example, Fine Calibration Operations 503 are performed by Control Circuit 203 in conjunction with SAR Logic Control and Minimum Error Code Detector 204 and Fine/Final Reference Generation Circuit 220. Continuing with the example, at operation 508F, assertion of Done 208 indicates the "Yes" path.

Various operations of Supply Transient Flow Diagram 500 correspond (in whole or in part) with various operations of On-Chip Supply Transient Drop and Supply Bounce System Operating Technique 150 (FIG. 1B). For example, Coarse Calibration Operations 502 corresponds with Coarse Calibration 153 (FIG. 1B) and Fine Calibration Operations 503 corresponds with Fine Calibration 154 (FIG. 1B).

FIG. 6 illustrates an example timing diagram for detecting supply transients.

More specifically, FIG. 6 illustrates an example timing diagram for detecting supply transients, such as drops or bumps on DVDD or DVSS conductors, as performed, e.g., by operation of Transient Detector Circuit 102.

The waveform illustrated by Comparator Output 610 corresponds to signal Output 110 (FIG. 1A and FIG. 2A2). The waveform illustrated by Done 608 corresponds to signal Done 208 (FIG. 2A1). The waveform illustrated by EN/EN ($I_{HYST}$) 607 corresponds to signal EN 293 (FIG. 2A1 and FIG. 2A2) that is produced by Mux and Register 209 (FIG. 2A1). The time interval indicated by Coarse [($V_{REF}$[C])] 602 corresponds to a first (coarse) calibration phase as illustrated by Coarse Calibration Operations 502 (FIG. 5) and performed in part via operation of Coarse/Initial Reference Generation Circuit 210 (FIG. 2A1 and FIG. 2A3). During Coarse [($V_{REF}$[C])] 602, assertion of Done 608 corresponds to the "Yes" path of operation 508C (FIG. 5).

The time interval illustrated by Fine/Final [($V_{REF}$[F])] 603 corresponds to a second (coarse) calibration phase as illustrated by Fine Calibration Operations 503 (FIG. 5) that follows Coarse [($V_{REF}$[C])] 602 and is performed in part via operation of Fine/Final Reference Generation Circuit 220 (FIG. 2A1 and FIG. 2A4). During Fine/Final [($V_{REF}$[F])] 603, assertion of Done 608 corresponds to the "Yes" path of operation 508F (FIG. 5).

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit as manufactured chips 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described may be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provide a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the concepts disclosed herein. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies disclosed herein. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the disclosure herein, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The disclosure herein also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the disclosure herein is not described with reference to any particular programming language. It will be appreciated that a variety of programming languages may be used to implement the teachings of the disclosure as described herein.

The disclosure herein may be provided as a computer program product, or software, which may include a machine-readable medium having stored thereon instructions, which may be used to program a computer system (or other electronic devices) to perform a process according to the disclosure herein. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

Herein (including the description, above, and the claims, below) terms such as first, second, third, and so forth, are not indicative of order, value, or importance, unless otherwise stated. For example, regarding the placing of multiple instances of the transient detector circuit, the first instance and the second instance have no order, value, or importance relationship to each other. For another example, regarding the first calibration phase and the second calibration phase, as described above, the second calibration phase follows the first calibration phase, and therefore has an order relationship with the first calibration phase.

A system of one or more computers is configurable to perform particular operations, actions, and/or functions by virtue of having software, firmware, hardware, or a combination of them installed on the system that in operation causes or cause the system to perform the operations, actions, and/or functions. One or more computer programs are configurable to perform particular operations, actions, and/or functions by virtue of including instructions that, when executed by data processing apparatus, cause the apparatus to perform the operations, actions, and/or functions.

An aspect includes a method. The method includes determining a first voltage value using a comparator operating based on a first hysteresis value; determining a second voltage value using the comparator operating based on a second hysteresis value and in dependence on the first voltage value, and providing one or more indications of at least one of the first voltage value and the second voltage value. Other embodiments of this aspect include corresponding computer systems, apparatus, and computer programs recorded on one or more computer storage devices, each configured to perform actions of the methods.

Implementations optionally include one or more of the following features. The method optionally includes adjusting one or more of the first hysteresis value and the second hysteresis value. Further, optionally the first hysteresis value is equal to a difference between (1) a first high threshold value of the comparator and (2) a first low threshold value of the comparator; and the second hysteresis value is equal to a difference between (1) a second high threshold value of the comparator and (2) a second low threshold value of the comparator. The method further optionally includes determining at least one of (1) a digital VDD (DVDD) measurement and (2) a digital VSS (DVSS) measurement using the one or more indications. The method further optionally includes determining at least one of (1) a drop measurement and (2) a bump measurement. The first hysteresis value is greater than the second hysteresis value. The determining the first voltage value is according to a first successive approximation technique and the determining the second voltage value is according to a second successive approximation technique. Implementations of the described techniques optionally include hardware, a method or process, or computer software on a computer-accessible medium.

An aspect includes a non-transitory computer readable medium that optionally includes stored instructions which when executed by a processor, cause the processor to generate a digital representation of a circuit. The circuit performs a calibration with respect to measuring a voltage using a comparator according to a first hysteresis value to determine a first analog reference voltage; performs a calibration with respect to measuring a voltage using the comparator according to a second hysteresis value to determine a second analog reference voltage, and provides one or more indications of at least one of (1) results of the calibration that determines the first analog reference voltage and (2) results of the calibration that determines the second analog reference voltage.

Implementations optionally include one or more of the following features. The non-transitory computer readable medium where the first hysteresis value is greater than the second hysteresis value. The circuit further determines at least one of (1) a digital VDD (DVDD) measurement and (2) a digital VSS (DVSS) measurement using the one or more indications, and where at least one of (3) the DVDD measurement and (4) the DVSS measurement optionally includes at least one of (5) a drop measurement and (6) a bump measurement. The circuit further operates a first reference network that optionally includes one or more resistors to provide a first reference value to the comparator. The circuit further provides a reference voltage to the comparator as at least one of (1) a first reference value and (2) a second reference value, and where the circuit performs the first calibration that determines the first analog reference voltage is in dependence on the first reference value and the circuit performs the calibration that determines the second analog reference voltage is in dependence on the second reference value. Further, optionally the circuit performing the calibration that determines the first analog reference voltage optionally includes performing a coarse binary search using a successive approximation register; the performing the calibration that determines the second analog reference voltage optionally includes performing a fine binary search using at least a portion of the successive approximation register; and the performing the coarse binary search uses C iterations, the performing the fine binary search uses F iterations, and C is greater than F, F and C each being integers that are greater than zero. Optionally, the circuit includes the comparator, the one or more indications are usable to determine a supply variation measurement, and the supply variation measurement is of a digital supply powering at least a portion of the integrated circuit. The comparator receives an analog VDD of an analog supply, the analog VDD having a voltage value that accommodates measurements of a summed voltage value of (1) a digital VDD (DVDD) of the digital supply and (2) a maximum measurable bump of the DVDD. The comparator receives an analog VSS of an analog supply, the analog VSS having a voltage value that accommodates measurements of a summed voltage value of (1) a digital VSS of the digital supply and (2) a maximum measurable dip of the digital VSS. Implementations of the described techniques optionally include hardware, a method or process, or computer software on a computer-accessible medium.

An aspect includes a system. The system includes a comparator that provides a comparator output based on a hysteresis input; an analog selector that selectively provides, as the hysteresis input, one of (1) a first hysteresis value and (2) a second hysteresis value; a successive approximation register that receives the comparator output; and control circuitry, where the control circuitry controls the analog selector to selectively provide, to the comparator, one of (1) the first hysteresis value and (2) the second hysteresis value, and where the control circuitry further controls the successive approximation register (1) to perform a calibration that is in dependence on the comparator receiving the first hysteresis value and (2) to perform a calibration that is in dependence on the comparator receiving the second hysteresis value.

Implementations optionally include one or more of the following features. The system optionally includes a first current source enabled to provide a first current value for the first hysteresis value and a second current source enabled to provide a second current value for the second hysteresis value, and where the first hysteresis value is greater than the second hysteresis value. The system where the comparator output is further in dependence on a comparison input; the system further comprises an analog subtractor coupled to receive at least one input voltage and to provide an output voltage; the at least one input voltage is in dependence on a result from the calibration that is in dependence on the comparator receiving the first hysteresis value; and the comparison input is in dependence on the output voltage.

What is claimed is:

1. A method, comprising:

determining a first voltage value using a comparator operating based on a first hysteresis value;

determining a second voltage value using the comparator operating based on a second hysteresis value and in dependence on the first voltage value; and providing one or more indications of at least one of the first voltage value and the second voltage value.

2. The method of claim 1, further comprising adjusting one or more of the first hysteresis value and the second hysteresis value.

3. The method of claim 1, wherein:

the first hysteresis value is equal to a difference between (1) a first high threshold value of the comparator and (2) a first low threshold value of the comparator; and the second hysteresis value is equal to a difference between (1) a second high threshold value of the comparator and (2) a second low threshold value of the comparator.

4. The method of claim 1, wherein the method further comprises determining at least one of (1) a digital VDD (DVDD) measurement and (2) a digital VSS (DVSS) measurement using the one or more indications.

5. The method of claim 1, wherein the method further comprises determining at least one of (1) a drop measurement and (2) a bump measurement.

6. The method of claim 1, wherein the first hysteresis value is greater than the second hysteresis value.

7. The method of claim 1, wherein the determining the first voltage value is according to a first successive approximation technique and the determining the second voltage value is according to a second successive approximation technique.

8. A non-transitory computer readable medium comprising stored instructions, which when executed by a processor, cause the processor to generate a digital representation of a circuit, wherein the circuit:

performs a calibration with respect to measuring a voltage using a comparator according to a first hysteresis value to determine a first analog reference voltage;

performs a calibration with respect to measuring a voltage using the comparator according to a second hysteresis value to determine a second analog reference voltage; and provides one or more indications of at least one of (1) results of the calibration that determines the first analog reference voltage and (2) results of the calibration that determines the second analog reference voltage.

9. The non-transitory computer readable medium of claim 8, wherein the first hysteresis value is greater than the second hysteresis value.

10. The non-transitory computer readable medium of claim 8, wherein the circuit further determines at least one of (1) a digital VDD (DVDD) measurement and (2) a digital VSS (DVSS) measurement using the one or more indications, and wherein at least one of (3) the DVDD measurement and (4) the DVSS measurement comprises at least one of (5) a drop measurement and (6) a bump measurement.

11. The non-transitory computer readable medium of claim 8, wherein the circuit further operates a first reference network comprising one or more resistors to provide a first reference value to the comparator.

12. The non-transitory computer readable medium of claim 11, wherein the circuit further operates a second reference network comprising one or more resistors to provide a second reference value to the comparator.

13. The non-transitory computer readable medium of claim 8, wherein the circuit further provides a reference voltage to the comparator as at least one of (1) a first reference value and (2) a second reference value, and wherein the circuit performs the calibration that determines the first analog reference voltage in dependence on the first reference value and the circuit performs the calibration that determines the second analog reference voltage in dependence on the second reference value.

14. The non-transitory computer readable medium of claim 8, wherein:

the performing the calibration that determines the first analog reference voltage comprises performing a coarse binary search using a successive approximation register;

the performing the calibration that determines the second analog reference voltage comprises performing a fine binary search using at least a portion of the successive approximation register; and the performing the coarse binary search uses C iterations, the performing the fine binary search uses F iterations, and C is greater than F, F and C each being integers that are greater than zero.

15. The non-transitory computer readable medium of claim 8, wherein the circuit comprises the comparator, the one or more indications are usable to determine a supply variation measurement, and the supply variation measurement is of a digital supply powering at least a portion of the integrated circuit.

16. The non-transitory computer readable medium of claim 15, further wherein the comparator receives an analog VDD of an analog supply, the analog VDD having a voltage value that accommodates measurements of a summed voltage value of (1) a digital VDD (DVDD) of the digital supply and (2) a maximum measurable bump of the DVDD.

17. The non-transitory computer readable medium of claim 15, further wherein the comparator receives an analog VSS of an analog supply, the analog VSS having a voltage value that accommodates measurements of a summed voltage value of (1) a digital VSS of the digital supply and (2) a maximum measurable dip of the digital VSS.

18. A system comprising:

a comparator that provides a comparator output based on a hysteresis input;

an analog selector that selectively provides, as the hysteresis input, one of (1) a first hysteresis value and (2) a second hysteresis value;

a successive approximation register that receives the comparator output; and control circuitry, wherein the control circuitry controls the analog selector to selectively provide, to the comparator, one of (1) the first hysteresis value and (2) the second hysteresis value, and wherein the control circuitry further controls the successive approximation register (1) to perform a calibration that is in dependence on the comparator receiving the first hysteresis value and (2) to perform a calibration that is in dependence on the comparator receiving the second hysteresis value.

19. The system of claim 18, further comprising a first current source enabled to provide a first current value for the first hysteresis value and a second current source enabled to provide a second current value for the second hysteresis value, and wherein the first hysteresis value is greater than the second hysteresis value.

20. The system of claim 19, wherein:

the comparator output is further in dependence on a comparison input;

the system further comprises an analog subtractor coupled to receive at least one input voltage and to provide an output voltage;

the at least one input voltage is in dependence on a result from the calibration that is in dependence on the comparator receiving the first hysteresis value; and the comparison input is in dependence on the output voltage.

* * * * *